US010650864B1

(12) United States Patent
Harwood et al.

(10) Patent No.: US 10,650,864 B1
(45) Date of Patent: May 12, 2020

(54) HARD DISK DRIVE WITH COVER AND COVER SUPPORT

(71) Applicant: Seagate Technology LLC, Cupertino, CA (US)

(72) Inventors: Gordon A. Harwood, Minneapolis, MN (US); Hany Michael Gross, Eden Prairie, MN (US); David J. Jennings, Edina, MN (US); Stanislaw Dobosz, Savage, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 16/206,122

(22) Filed: Nov. 30, 2018

(51) Int. Cl.
G11B 33/02 (2006.01)
H05K 5/03 (2006.01)
G11B 33/08 (2006.01)
G11B 33/12 (2006.01)
H05K 5/02 (2006.01)

(52) U.S. Cl.
CPC ............ *G11B 33/027* (2013.01); *G11B 33/08* (2013.01); *G11B 33/128* (2013.01); *H05K 5/0239* (2013.01); *H05K 5/03* (2013.01)

(58) Field of Classification Search
CPC .............................. G11B 33/027; G11B 33/08
USPC .............................................. 360/99.2–99.26
See application file for complete search history.

(56) References Cited

U.S. PATENT DOCUMENTS

| 5,677,813 | A | * | 10/1997 | Yoshida | G11B 33/08 360/99.18 |
| 5,852,702 | A | * | 12/1998 | Nishida | B41J 2/465 385/130 |
| 6,473,270 | B1 | * | 10/2002 | McDonald | G11B 5/54 360/265.1 |
| 6,683,747 | B2 | | 1/2004 | Bernett | |
| 7,218,473 | B2 | | 5/2007 | Bernett et al. | |
| 7,817,373 | B2 | * | 10/2010 | Choi | G11B 33/08 360/97.19 |
| 8,854,766 | B1 | * | 10/2014 | Gustafson | G11B 33/1486 360/97.12 |
| 8,885,290 | B1 | | 11/2014 | Gustafson et al. | |
| 9,001,458 | B1 | * | 4/2015 | Vitikkate | G11B 25/043 360/97.22 |
| 2008/0068746 | A1 | * | 3/2008 | Kaneko | G11B 25/043 360/97.14 |
| 2008/0088969 | A1 | * | 4/2008 | Uefune | G11B 25/043 360/99.21 |
| 2012/0162824 | A1 | * | 6/2012 | Sudo | G11B 25/043 360/236.8 |
| 2014/0300989 | A1 | * | 10/2014 | Smyth | G11B 21/22 360/75 |
| 2017/0071064 | A1 | * | 3/2017 | Hooton | G06F 1/1613 |
| 2018/0337477 | A1 | * | 11/2018 | Yamamoto | G11B 25/043 |

* cited by examiner

Primary Examiner — Allen T Cao
(74) Attorney, Agent, or Firm — Kagan Binder PLLC

(57) ABSTRACT

Described are electronic hard disk drives that are made to include: a base; a cover; interior components such as a stack of magnetic recording disks, reading and recording heads, electronics to read and record and to transfer data to and from an external electronic device; and a cover support at the interior of the device to inhibit movement of the cover.

19 Claims, 6 Drawing Sheets

HARD DISK DRIVE WITH COVER AND COVER SUPPORT

FIELD

The invention relates to electronic hard disk drives that are made to include: a base; a cover; interior components such as a stack of magnetic recording disks, reading and recording heads, electronics to read and record and to transfer data to and from an external electronic device; and a cover support at the interior of the device to inhibit movement of the cover.

BACKGROUND

Electronic data storage devices, e.g., hard disk drives or "HDDs," perform essential commercial and personal functions in today's digital information-intensive world. As our reliance on these devices increases, so do the performance requirements of these devices, including their combined requirements for speed and reliability. Ongoing goals for new hard disk drive products are to increase data capacity and to reduce or minimize the occurrence of data storage errors.

Commercial hard disk drives are constructed of certain common components that include a structural base that defines an interior (e.g., a "cavity"), and a cover that encloses and seals the interior. The cover includes a rigid planar, e.g., flat, sheet often made of metal that is secured to the base and covers the interior. Within the interior are interior components at such as a stack of rotatable magnetic recording disks, reading and recording heads, motors, actuators, optional filters or environmental control modules, and electronic components that are adapted to communicate and transfer electronic data to and from an external electronic device.

Like other computer and electronic products, each next version or next generation of a hard disk drive product is expected to achieve an ever-increasing level of performance. Improved performance can mean a higher total amount of data storage capacity, increased speed and reliability, or all of these. To increase the data storage capacity of a hard disk drive, options include: placing more data onto each of multiple hard magnetic disks contained in a hard disk drive device (i.e., to increase "areal density" of the hard magnetic disks, which is a measure of the quantity of information bits that can be stored on a given area of disk surface); and placing more hard magnetic disks at the interior of a hard disk drive of a given exterior size, by increasing the interior space of the device.

One specific option for improving performance and storage density is to include a low-density atmosphere at the disk drive interior, for example an atmosphere of helium. A low density interior atmosphere can reduce the amount of drag force that affects a spinning disk or a stack of closely-spaced spinning disks. The reduced drag can significantly reduce the amount of power required to cause a disk stack to spin. Also, the low density atmosphere can reduce the amount of unwanted, non-rotational movement or "flutter" that occurs in a spinning disk, or undesired movement of a suspension assembly that works in conjunction with the spinning disk. Given that data is stored on data tracks on the spinning disks, reducing unwanted motion of a disk or suspension assembly can allow for reducing the width or pitch of the data tracks, which allows for increased track density, and consequently areal density.

A different general approach for achieving continued performance improvements is to increase the internal space of a disk drive by reducing the size of the components of the enclosure, such as the base or cover. Reducing a thickness dimension of a cover can increase the interior space of the hard disk drive. Even if by just a little, this increase in the amount of interior space may be useful to increase the storage capacity of a hard disk drive.

SUMMARY

The invention relates to novel hard disk drive product designs that include a "cover support" that reduces an amount of movement or "deflection" of a cover of a hard disk drive.

A cover of a hard disk drive includes a perimeter and a flat (planar) portion within the perimeter. The perimeter is typically attached securely to a perimeter of a base to form a seal between the base and the cover. The flat portion spans the upper portion of the interior and may be unattached, or may optionally be secured to the base indirectly, e.g., through an interior component, at certain selected locations. The flat portion of the cover, especially at locations that are sufficiently spaced from secured locations, can be susceptible to movement, e.g., "deflection" or "vibration," which can produce one or more negative effects in the hard disk drive.

Movement of the flat portion of the cover may occur during manufacturing or use (e.g., during installation) of the disk drive due to handling of the hard disk drive, e.g., manually. Forces exerted on an exterior of a hard disk drive cover during manufacturing or use can be sufficient to deflect the cover in the direction of interior components of the hard disk drive. The amount of space between certain interior components of a hard disk drive and the interior surface of the cover may be very small, which means that even a very small amount of deflection of the cover toward the hard disk drive interior might cause the internal surface of the cover to come into contact with an interior component. A potential result of this type of contact can be the release of debris particles from one or both of the contacting surface, i.e., the generation of tiny particles that become dislodged from one of the contacting surfaces and released into the interior atmosphere of the hard disk drive. These debris particles have the potential to interfere with the operation of the internal disk drive components. As another possible result of the contact, one or more of the cover and the contacted interior component might potentially be non-elastically deformed or otherwise physically damaged. Any such deformation or physical damage, even if minutely small, can also affect the successful operation of the disk drive during use.

Another potential cause of movement of the flat portion of the cover is a negative pressure that is produced at a hard disk drive interior when the interior is evacuated during assembly. When assembling certain types of hard disk drives, e.g., those that contain a low density atmosphere at the interior, the gaseous contents of the interior must be evacuated and then refilled with the low density (gaseous) atmosphere. During the evacuation step, the flat portion of the cover may experience deflection toward the interior due to a negative interior pressure relative to pressure external to the hard disk drive. This amount of deflection of the flat portion of the cover toward the interior, as with deflection caused by manual handling of the disk drive (see above), may also cause the cover to contact an interior component, which may in turn cause damage to the interior component or the cover, generate particle debris at the interior (due to the contact), or both.

In a different fashion, during use of a hard disk drive, movement (e.g., vibration) of the flat portion of the cover can be caused by acoustic energy impinging on the cover. A hard disk drive, alone or as part of a collection with other hard disk drives supported by a cabinet, may be contained in a ventilated or cooled environment with a flow of air being caused to pass over exterior surfaces of the hard disk drive device for cooling. One or a collection of fans may be used to produce the air flow. These fans also produce acoustic energy that can be absorbed by a cover of a hard disk drive. This acoustic energy may cause movement (e.g., vibration) of the flat portion of the cover and the energy of the movement may be transferred through the gaseous interior atmosphere to a moving interior component such as to a moving disk or a read-write head. Given the extremely small width of the data tracks on the disks, even this extremely minute amount of movement of an interior component of the hard disk drive can affect performance of the hard disk drive, for example as manifested by an increased error rate of the disk drive.

Reducing the amount of movement (e.g., deflection, vibration, etc.) of a cover of a hard disk drive during assembly or use can improve performance of the hard disk drive by preventing one or more of their described negative effects. According to Applicant's invention described herein, a support structure (referred to as a "cover support") is included at the interior of a hard disk drive to inhibit movement of the cover, such as deflection that can occur during assembly or use, or vibration that may occur during use in the presence of acoustic energy. The support can be any support structure generally, but does not include previously known or used fasteners and associated structures that may have been used previously to secure a cover to a base, such as by the use of screws or other fasteners that are placed through the cover at an opening of the cover and engage an internal structure adjacent to the opening.

In one presently-exemplified version, a cover support can be incorporated into an otherwise useful and functional interior component of a hard disk drive such as environment control module (ECM). An environmental control module that is modified to include a cover support combines the ECM functionality with a cover support functionality that prevents deflection or other movement of the cover to a degree that may cause damage to an interior component of the hard disk drive during assembly or use. Additionally, this example cover support can provide a damping (vibration prevention) effect upon the cover in a way that may improve functioning of the hard disk drive, e.g., to reduce error rate of the drive by improving the ability of read-write heads to follow tracks on a magnetic disk drive more accurately. Because the cover support is incorporated into an interior component that is already part of the device (the ECM), the marginal cost increase of adding the cover support is minimized, and no special factory tooling is needed. Additionally, because the ECM may be placed within a hard disk drive interior after certain other interior components such as an actuator assembly, armature assembly, and hard recording disk assembly (HDA), all of the space necessary for loading those other interior components into the interior space is preserved.

Also in an example version, the cover may advantageously be constructed of a laminated metal plate that has a lower rigidity but improved vibration resistance relative to a solid metal plate of the same thickness. With increasing numbers of magnetic recording disks being designed into high capacity hard disk drives, it is important find ways to increase the "vertical" (top-to-bottom) height of an interior space of a hard disk drive, to allow greater numbers of disks to fit into the interior. Reducing a thickness of the cover may increase a vertical dimension of the interior space of the hard disk drive. Making the cover thinner, however, can reduce the rigidity of the cover and cause the cover to be more prone to movement such as bending, deflection, or vibration. The cover support described herein can reduce movement of (deflection of, vibration of, etc.) a cover of a hard disk drive to allow a cover of a reduced thickness to be used in the hard disk drive.

The cover support can be used with any hard disk drive that includes a base and a cover. This includes currently commercial hard disk drives such as those referred to as "2.5 inch" or "3.5 inch" hard disk drives that contain a base and a single ("outer") cover, with an air atmosphere at the interior of the disk drive. This also includes currently commercial hard disk drives referred to as "3.5 inch" disk drives that include a base, a first (internal, process) cover, an outer cover that encloses the process cover, and a low density (e.g., helium) atmosphere at the interior of the disk drive. These examples are not to be considered to limit the usefulness or scope of the invention with any other type of cover or any other size or configuration of hard disk drives.

In one aspect, the invention relates to a hard disk drive that includes a base comprising an interior; a cover secured to the base at a perimeter and covering the interior, the cover comprising an interior surface on an interior side of the cover; and components within the interior. The interior components include: a disk stack assembly comprising multiple rotatable hard magnetic disks, and an armature assembly comprising multiple armatures in a pivoting stack, the assembly comprising armatures and magnetic heads capable of magnetically engaging the disks. The device also includes a cover support at the interior that limits movement of the cover in a direction toward the interior by contacting the interior side of the cover at a non-apertured location of the cover.

In another aspect the invention relates to a method of assembling a hard disk drive that includes: a base comprising an interior; a cover secured to the base at a perimeter and covering the interior, the cover comprising an interior surface on an interior side of the cover; components within the interior that include a disk stack assembly comprising multiple rotatable hard magnetic disks, and an armature assembly comprising multiple armatures in a pivoting stack, the assembly comprising armatures and magnetic heads capable of magnetically engaging the disks; and a cover support at the interior that limits movement of the cover in a direction toward the interior by contacting the interior side at a non-apertured location of the cover. The method includes: placing the cover over the base and securing the cover to the base at the perimeter of the base, removing a gaseous atmosphere from the interior, and placing a low density gaseous atmosphere at the interior.

Figure 1:
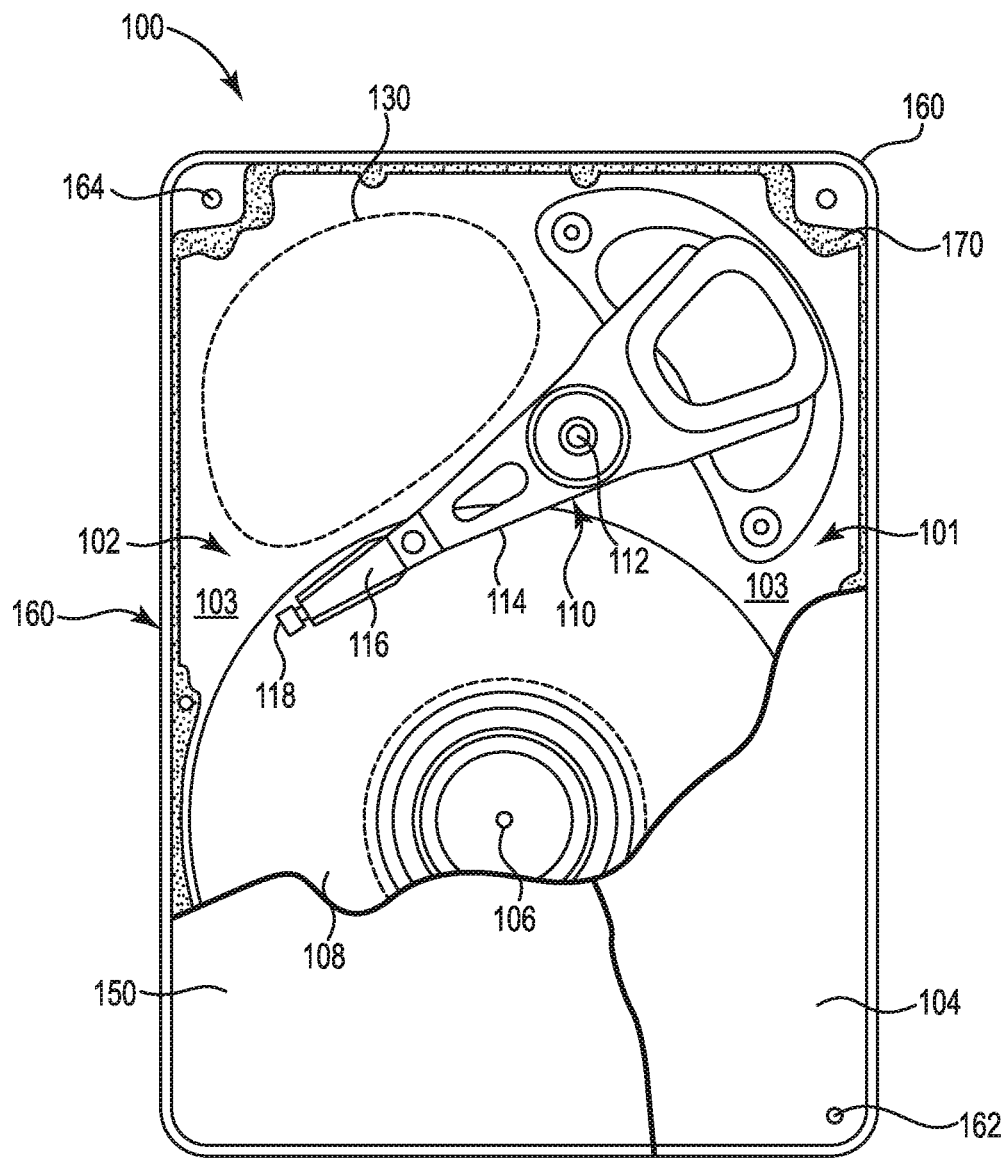
FIG. 1 is a top view of an example hard disk drive as described with example internal components.

All figures are schematic and not to scale.

DETAILED DESCRIPTION

The invention relates to electronic hard disk drives that include a structural base that defines an interior (e.g., a "cavity"), and a cover that encloses the interior and the interior components. At the interior are interior components such as a stack of rotatable magnetic recording disks, motors, reading and recording heads, an actuator, optional filters or an environmental control module, and electronic components and controls that are adapted to communicate and transfer electronic data to and from an external electronic device. The cover includes a flat, planar, and rigid plate made with metal that is installed to be positioned above the interior. The cover also includes a perimeter that is secured to vertically-extending sidewalls at a perimeter of the base, normally in a manner that produces a seal. The cover may be the only cover that is included in the device, i.e., a single exterior cover that covers the interior and is also exposed as an exterior surface of the device. Alternately, the device may include an additional cover (a second cover or an "outer" cover) that encloses the first cover, which may in these hard disk drives be referred to as an "inner" cover or a "process" cover.

According to the invention, the hard disk drive includes a cover support that suppresses movement of the cover at a location of the cover that is spaced (horizontally) from the perimeter, i.e., at a flat, central portion of the cover. The cover support is a structure that is located within the hard disk drive (at the interior of the hard disk drive) and that can contact an interior surface of the cover to prevent movement of the cover during manufacturing or use of the device. The cover support acts as a "deflection limiter" to physically inhibit movement of the cover relative to the interior components of the hard disk drive. The motion of the cover that is prevented includes motion in a direction toward the interior, i.e., in a direction toward the base, vibrations, or both.

Movement of the flat portion of the cover in a direction toward the interior, at a location spaced from the cover perimeter, can occur in response to any of various input forces upon the cover. The movement can occur during manufacturing or during use by an end user, and can have any of a variety of different negative effects on the performance of the hard disk drive.

As one possibility, during customer installation, a cover of a hard disk drive can be caused to be deflected toward an interior of the device due to forces that are placed on the cover by manual handling of the drive. A hard disk drive may be held manually in a manner that "squeezes" opposed top and bottom surfaces at a cover and base. According to this example, a hard disk drive is typically handled and moved manually when the drive is installed in a cabinet. This manual handling may place pressure on the cover, and the pressure may cause the flat interior portion of the cover (spaced from the edges) to be deflected (i.e., to move slightly) in a direction toward the interior.

Only a very small amount of distance normally separates an interior surface of the cover from one or more interior components of the hard disk drive, such as an actuator, an armature, a reading or recording head attached to the armature, a hard magnetic recording disk, an environmental control module, support structures, or another interior component. Even a small amount of deflection of the cover in a direction toward the interior can cause the interior surface of the cover to contact an interior component. And just a slight amount of contact between the two may result in damage to the interior component or the cover, or may produce minute particles that become debris at the otherwise highly clean and debris-free, particle-free, hard disk drive interior. Either result, e.g., damage to the internal structure or debris produced at the interior, can lead to reduced performance or failure of the hard disk drive. Of note, this type of deflection can occur in drives that include only a single (outer) cover, and also in drives that include both an inner cover and an outer cover. In the latter type of drives, the inner cover and the outer cover are typically separated by only a tiny distance (e.g., 4 mils) at most, or may even be in contact with each other (e.g., due to a negative interior pressure) at use conditions or be bonded together by a thin layer of adhesive or foam; deflecting the outer cover can cause deflection of both the outer cover and the inner cover.

As another possibility, during manufacturing, hard disk drives that are assembled to contain a low density atmosphere at the interior are processed using an evacuation step to remove an interior atmosphere of air that is present at the interior and replace the air with a low density gas. During evacuation, the interior is placed at a negative pressure relative to the exterior. The negative internal pressure may cause the cover to be deflected (i.e., move slightly) in a direction toward the interior. This amount of deflection may cause contact between the interior surface of the cover and an interior component, potentially resulting in damage to the interior component of the drive, damage to the cover, or debris being produced at the interior, any of which may cause a reduced performance of the hard disk drive.

As yet another different cause of movement of the cover, a hard disk drive may be placed during use in an environment that includes acoustic energy. As one common example, a hard disk drive, alone or as part of a collection of many (e.g., tens or hundreds of) hard disk drives, may be contained in ventilated or cooled environment, e.g., supported in a cabinet or rack with multiple other hard disk drives or other computer or electronic devices such as processors. A flow of forced air may be caused to pass over exterior surfaces of the hard disk drives and other electronic components by one or more fans. A fan produces acoustic energy that can be transmitted to the internal components of a hard disk drive through a cover of a hard disk drive. This acoustic energy may cause movement of the cover, e.g., vibration, at a flat portion of the cover spaced from the cover perimeter. The vibrations can be transferred from the cover to the interior components of the hard disk drive. The vibrating cover can produce minute vibrations of the interior components, which can result in errors during operation, meaning potential data errors or data loss during operation.

A hard disk drive as described can be any of various hard disk drive products that include: a structural base that defines an interior, e.g., a "cavity" defined by a horizontally-extending bottom and vertically-extending sidewalls at a perimeter of the base; a cover that encloses the interior and the interior components; and interior components at the interior. The interior components may include, for example: a stack of rotatable magnetic recording disks, reading and recording heads attached to armatures, an actuator to move one or more armatures, one or more motors, optional filters or an environmental control module, and electronic components adapted to control the interior components and communicate and transfer electronic data to and from an external electronic device. The interior includes the interior components of the hard disk drive and may include either a low density gaseous atmosphere (e.g., a helium atmosphere) or an air atmosphere, depending on the product design. If the device is one that includes a low density atmosphere, the device may optionally include a second cover (an "outer" cover) that encloses the previously-mentioned cover that encloses the interior, which in these products (if a second cover is present) may be referred to as an "inner" or a "process" cover.

FIG. 1 illustrates an example hard disk drive 100, which includes base 102 to which various interior components of disk drive 100 are mounted either directly or indirectly. Base 102 includes at a lower portion a flat or planar horizontally-extending bottom 103 having a perimeter, with base sidewalls 160 extending from the bottom at the perimeter in vertical direction. Cover 104, shown partially cut away, cooperates with base 102 to form a housing that defines enclosed interior 101. Cover 104, at the perimeter, engages base sidewalls 160 and is secured to the sidewalls, e.g., by fasteners such as screws. Gasket 170 can be included between a lower (bottom, interior) surface of cover 104 and base sidewall 160.

Cover 104 includes a flat or planar sheet having a perimeter at an edge and a flat interior portion located within and spanning the perimeter and covering the interior components. The cover, referred to as flat or planar, may be a cover that is entirely flat or, as is known, may be a cover that is substantially flat and planer and that includes one or more surface structures such as embossing, straight or curved ridges or protrusions, openings with countersinking, or the like. The planar sheet may be stamped to include embossing or openings (apertures) for fasteners such as screws, especially at the perimeter. Example openings can be at a perimeter (e.g., to allow the fastener to secure the cover to a base sidewall, e.g., within 1 centimeter from the perimeter edge), to fasten the cover to the base. Other optional openings can be at the interior area of the sheet, meaning located more than 1 centimeter from an edge; such openings may be used for a screw or other fastener passing through the cover and engaging an internal structure such as a hub of a disk stack or a pivot of an armature assembly. According to certain example hard drives of the present description, the cover does not include apertures spaced more than one centimeter from an edge that allow passage of a fastener for engaging the fastener with a hub of a disk stack or a pivot of an armature assembly. See FIG. 3.

Interior components of example hard disk drive 100 include a spindle motor 106, which rotates one or more disks 108 of a hard disk assembly (HDA). Information is written to and read from tracks on disks 108 through heads 118 and with the use of actuator assembly 110. Actuator 110 rotates during use about a bearing shaft assembly 112 positioned adjacent to hard magnetic recording disks 108. Actuator assembly 110 includes a plurality of actuator arms 114 (a.k.a. armatures) which extend toward disks 108, with a flexure 116 extending from each actuator arm 114. Mounted at a distal end of each flexure 116 is a slider 118, which has a shape that causes the slider to fly in close proximity above a corresponding surface of an associated magnetic recording disk 108.

Figure 2:
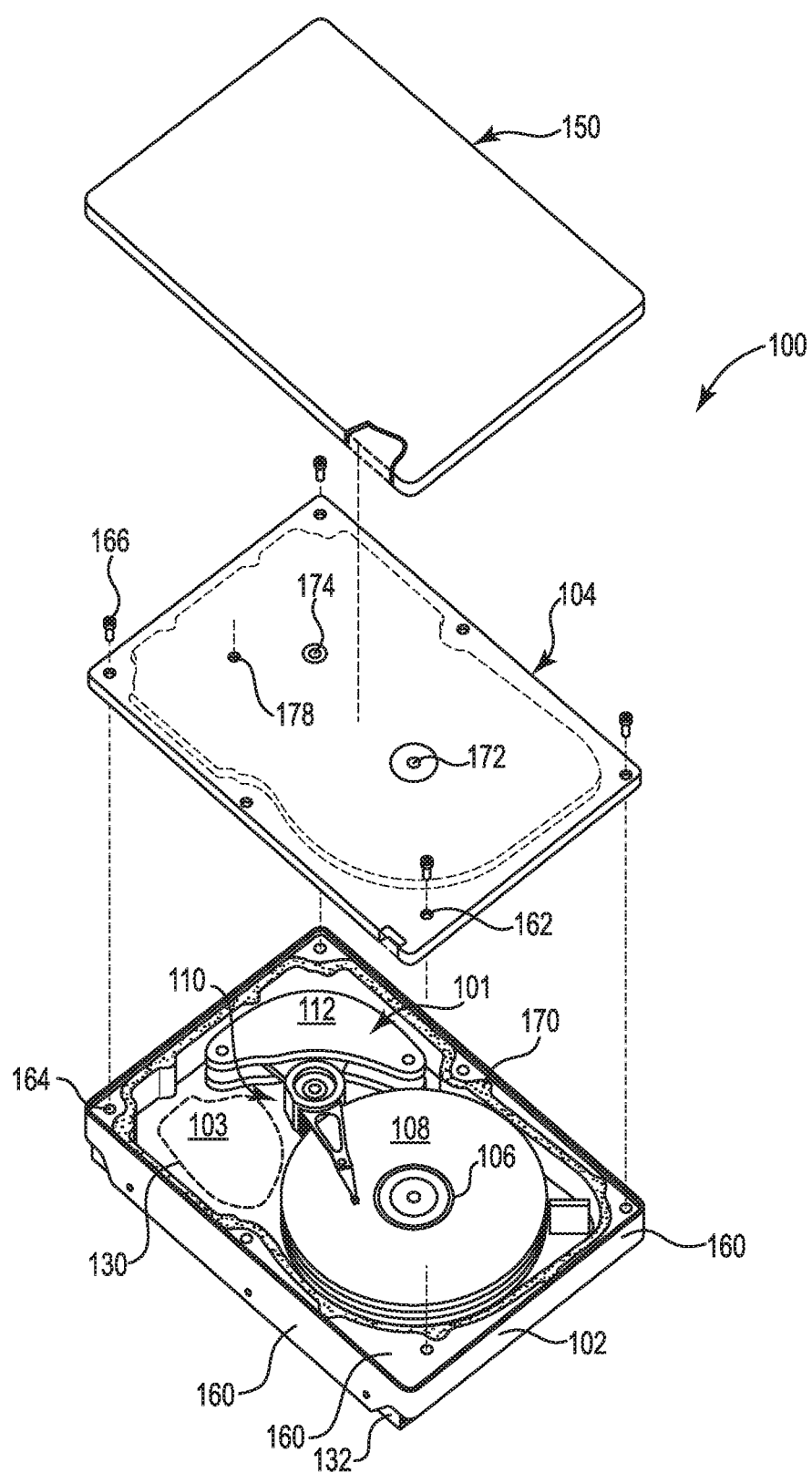
FIG. 2 is a blow-up view of an example hard disk drive as described with example internal components.

Cover 104 is installed over base 102 with a first or "interior" (e.g., bottom) surface of cover 104 facing in a direction toward interior 101 and the interior components of the hard disk drive. A second (top) surface of cover 104 faces in the opposite direction and away from interior 101. As shown in the example of FIGS. 1 and 2, example disk drive 100 may include an optional "second" cover or "outer" cover 150 secured over a top of cover 104; in such a device, cover 104 may be referred to as an "inner" or a "process" cover. Outer cover 150 provides an added degree of sealing for interior 101 to contain a low density (e.g. helium) atmosphere, and to prevent leaking of the low density atmosphere out of interior 101 during a service lifetime of drive 100. Alternately, other types of hard disk drives, e.g., those that do not contain a low density atmosphere at interior 101, do not require and may exclude outer cover 150. For those devices, cover 104 is the outermost or "exterior" cover of disk drive 100, with the second (top) surface of 104 being an exterior surface of disk drive 100. See FIG. 3.

Referring now to FIG. 2, illustrated is an exploded perspective view of example disk drive 100 of FIG. 1, including cover 104 and optional second or "outer" cover 150. The perspective view shown at FIG. 2 includes an improved view of vertical base sidewalls 160 that extend around a perimeter of base 102 to provide an upper surface for attaching to a perimeter of cover 104. Cover 104 can be secured to sidewalls 160 in any useful manner, for example by being secured to upper surfaces of sidewalls 160 using fasteners such as screws 166 that can pass through holes 162 of cover 104. In the illustrated example, continuous rubber gasket 170 is positioned on an upper surface and around the perimeter of base sidewalls 160 so that gasket 170 engages the bottom (interior) surface of cover 104 to seal interior 101 and prevent gas leakage from interior 101, and to prevent unwanted contaminant leakage (e.g., moisture) into interior 101.

As illustrated at FIG. 2, example cover 104 may optionally provide structural support for and reduce movement of spindle motor 106 and bearing shaft assembly 112, relative to base 102. Example cover 104 includes openings 172 and 174 that correspond to spindle motor 106 and bearing shaft assembly 112, respectively. If desired or necessary, holes 172 and 174 can be effective to use cover 104 to stabilize spindle motor 106 and actuator assembly 110 in a known manner, such as by passing a screw or other fastener (not shown) through each hole to hold one or more of spindle motor 106 and bearing shaft assembly 112 of actuator assembly 110 against cover 104. In other embodiments, however (see FIG. 3) spindle motor 106, bearing shaft assembly 112, or both, are not stabilized by being secured to cover 104, and cover 104 can exclude one or both of holes 172 and 174, and no screw or other fastener is passed through either hole to secure cover 104 relative to spindle motor 106 or bearing shaft assembly 112.

Figure 3:
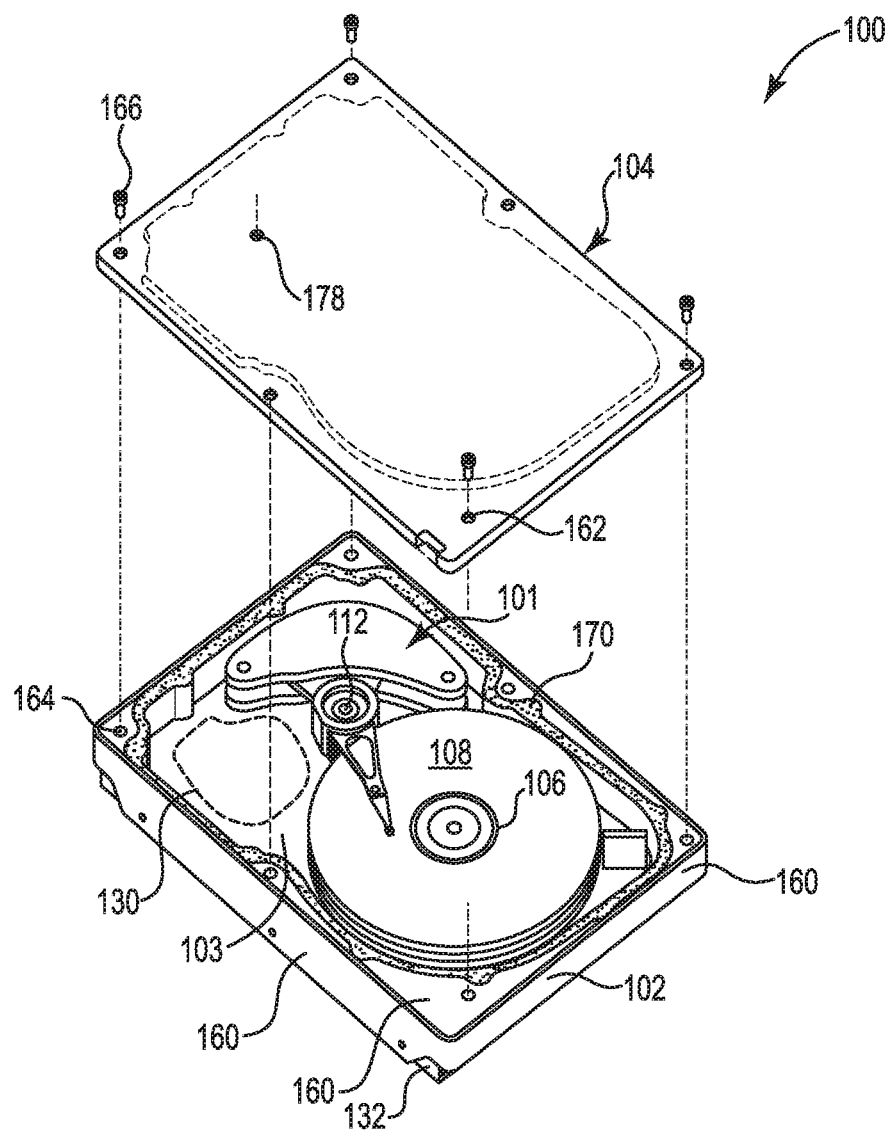
FIG. 3 is a blow-up view of an example hard disk drive as described with example internal components.

Referring to FIG. 3, cover 104 does not include a hole at a location adjacent either to bearing shaft assembly 112 or spindle motor 106 for passing a fastener through cover 104 to provide structural support to either or both of bearing shaft assembly 112 or spindle motor 106. An optional opening 178 can be used as a sealable fill port for evacuating interior 101, passing helium into interior 101, and then closing sealable fill port 178. Also as a different optional feature of example hard disk drive 100 of FIG. 3, this hard disk drive 100 does not require and can preferably exclude a second or "outer" cover 150, thereby placing cover 104 at an exterior and outer surface of drive 100 in its completed and finished form.

Certain locations of a cover have relatively greater susceptibility to movement than other locations. Areas that are not secured and that are located away from a secured location can be more prone to movement as compared to secured locations. Middle areas of the cover, meaning areas away from (spaced from) a perimeter and not near a secured location, can be most susceptible to movement. A "secured location" of a cover is a location of a cover that is held securely to another structure of the hard disk drive, such as by use of a screw, adhesive, weld, or other securing or fastening mechanism. Secured locations are sometimes located at a perimeter of the cover at a location where the perimeter of the cover meets a surface at the perimeter of the base, for example (but not necessarily) at an upper surface of a base sidewall. Other optional secured locations may be located at the flat, planar area of the cover, spaced from the perimeter, at locations at which a screw holds the cover in contact with an end of a spindle of a disk drive assembly (which is connected at a second end to a bottom of the base), or an end of an axle or spindle of an actuator assembly (which is connected at a second end to a bottom of the base).

Of various interior components of a hard disk drive, certain interior components, compared to others, may be more susceptible to accidental contact between the interior component and the cover. Examples of interior components that might be particularly susceptible to accidental contact with the cover interior surface include an actuator (e.g., as embodied by an actuator assembly 110 of FIGS. 1, 2, and 3), a head (see slider 118 at FIGS. 1, 2, and 3), and any other component that is located spatially very close to the interior surface of the cover. As one example, an upper surface of an actuator or a head may be located very close to an interior surface of a cover, with the cover installed. A very small amount of deflection of the cover may result in contact between an upper surface of the actuator or head and the interior surface of the cover. Consequently, a cover support may be particularly useful for preventing deflection of the area of the cover that, if the cover were to be sufficiently deflected, would cause contact between the interior surface of the cover and an upper surface of an actuator.

In an example hard disk drive that has interior components arranged as shown at the examples of FIG. 1, 2, or 3, an example of a useful location for a cover support is at region 130, which is in a portion of interior 101 that does not contain disks 108 or actuator assembly 110. In a completely-assembled hard disk drive, region 130 may contain a cover support. During assembly, including during placement of interior components of a hard disk drive interior, region 130 may remain at least partially un-occupied, especially during later stages of assembly, to facilitate placement of the interior components. Often, region 130 contains substantial open space during and after placement of the hard disk stack, to facilitate subsequent placement of armatures, an actuator, or both. In some hard disk drive products, region 130 may be a location of an environmental control module, which can be placed into interior 101 subsequent to placing each of disks 108 (in the form of a hard disk assembly), an armature or armature assembly (114), and an actuator or actuator assembly (110).

A cover support (a.k.a. "deflection limiter" or "cover deflection limiter") can be any internal structure that can be placed adjacent to or in contact with an internal surface of the cover to prevent movement of ("deflection" of, "vibration" of, etc.) the cover. A cover support may be an internal structure that is relatively rigid, that is directly or indirectly secured to and stationary (immobile) relative to the base, and that has an upper surface that is effective to provide support to and prevent movement of the cover. A cover support of the present invention is not considered to describe previously-known fasteners (e.g., screws and related internal structure) that pass through an opening in the cover; a screw that passes through an opening or hole (aperture) in a cover, and any related internal structure, are not considered to be a cover support of the present invention.

A cover support as described herein can include a surface at the interior of the hard disk drive that can contact the interior surface of the cover at a location that is not at or adjacent to an opening (i.e., at a "non-apertured" location), e.g., a location that is at least 5 millimeters, or at least 10, 15, or 20 millimeters from an aperture in the cover. Also preferably, a cover support as described can be located at a position that is spaced from a perimeter or edge of the cover by at least 5, 10, 15, or 20 millimeters.

The cover support can be effective to prevent movement of the cover in a direction toward the interior and in a manner that would cause the inner surface of the cover to contact an interior component of the hard disk drive in a manner that would potentially cause damage (e.g., non-elastic deformation) to the interior component or to the cover, or in a manner that would cause particulate or another form of debris to be produced due to the contact. The cover support may prevent deflection of the cover during manufacturing or use of the hard disk drive that might otherwise occur during handling of the hard disk drive (during use or during manufacturing), or that would otherwise occur upon evacuation of the interior of the disk drive during manufacturing as negative pressure is present at the interior. In some embodiments, the cover support contacts the cover upon installation of the cover and without any deflection or vibration of the cover occurring; the cover support contacts and prevents movement of the cover at neutral pressure (e.g., ambient pressure on both sides of the cover) as well as when negative pressure exists at the interior. In alternate embodiments, the cover support need not contact the cover at the time that the cover is installed, but can be placed at a location that is spaced from but sufficiently near the interior surface of the cover to allow for only a certain limited amount of deflection of the cover and to prevent additional deflection; i.e., after a slight amount of deflection of the installed cover, the interior surface of the cover comes into contact with the cover support and the cover support prevents any additional deflection.

The structure of the cover support may be a structure that is not otherwise a usual or necessary component of an operating hard disk drive. Examples include a rigid post, wall, buttress, block, pole, column, pillar, etc., or other rigid support structure that is present to function primarily or essentially only as a cover support. Such a structure is directly or indirectly secured and immobile relative to the base and has an upper surface that provides support to and prevents movement of the cover either by contacting the interior surface of the cover upon installation of the cover (in a non-deflected condition), or by contacting the interior surface of a cover that is installed and subsequently deflected (in an amount limited by the cover support) toward the cover support.

Other examples of a cover support may include a rigid structure that is or is added to a previously-used or previously-known interior component of a hard disk drive, e.g., an environmental control module that is adapted to include or to function as a cover support as described herein, that includes a surface on an upper portion thereof that provides support to and prevents movement of the cover either by contacting the interior surface of the cover upon installation of the cover (in a non-deflected condition), or by contacting the interior surface of a cover that is installed and subsequently deflected (in an amount limited by the cover support) toward the cover support.

The cover support, in any embodiment, may include a single structure or a combination of structures, with at least one of the structures of a combination being capable of contacting the interior surface of the cover to provide support for and prevent movement of the cover. In general, a cover support can include a rigid structure that includes a portion, e.g., a lower portion, that connects directly or indirectly to the base so that the cover support that contacts the cover is substantially immobile relative to the base. The rigid structure is substantially stationary relative to the base and extends toward or to the cover, where the rigid structure includes a surface (an upper or top surface) that directly or indirectly contacts the interior surface of the cover.

An upper surface of the rigid structure may be a surface of the cover support that directly contacts the interior surface of the cover. In other embodiments an optional connecting structure may be disposed between an upper surface of the rigid structure and the interior surface of the cover. The connecting structure may be rigid or non-rigid, e.g., flexible or elastomeric, and may be or may include a polymeric material such as an adhesive, gasket, foam, or a combination of layered materials such as an adhesive-coated film, foam, or tape. One example of such a cover support may include a rigid structure (e.g., a post, wall, buttress, or a surface of an environmental control module) that is immobile relative to the base, with a connecting structure such as a polymeric adhesive or gasket material (e.g., a polymeric "form-in-place-gasket" material) in contact with the upper surface of the rigid structure and also in direct contact with the interior surface of the cover.

Figure 4A:
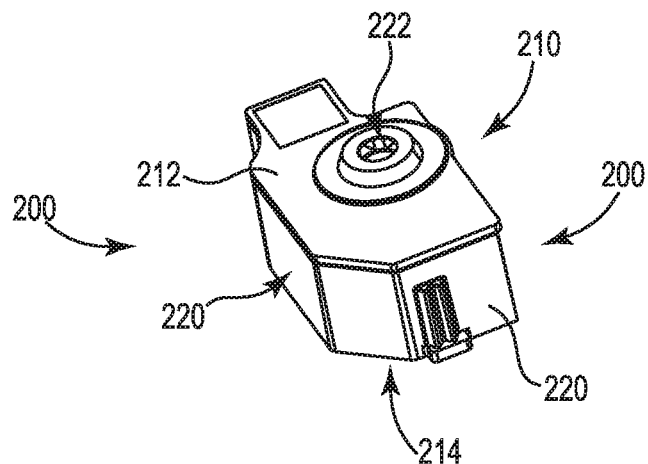
FIGS. 4A and 4B are top perspective views of example environmental control modules as described herein.
Figure 4B:
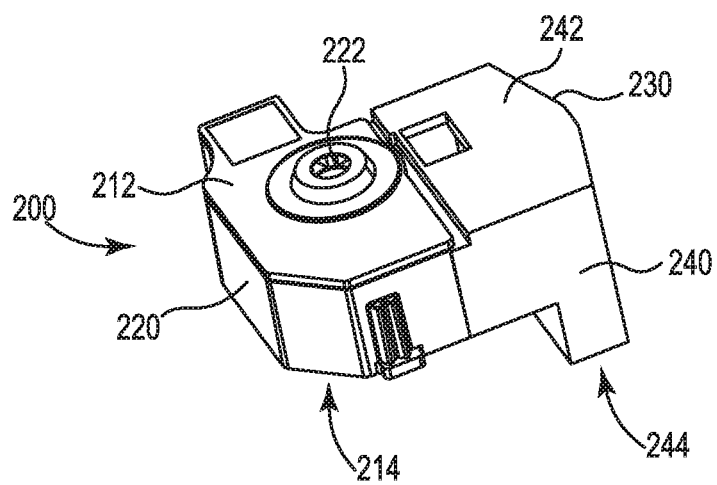
Figure 4C:
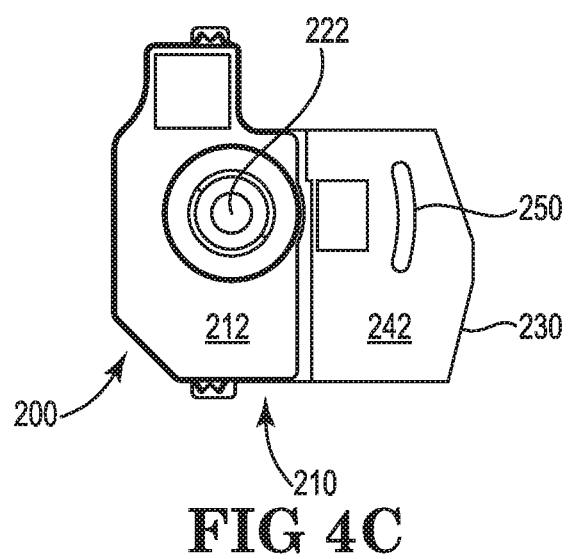
FIG. 4C is a top view of an example environmental control module as described herein.

In a particular and presently preferred example, a cover support may be a structure that is incorporated into an environmental control module, for example an environmental control module that can be placed at region 130 of an interior 101 of a hard disk drive 100 as illustrated. Example environmental control modules 200 are illustrated at FIGS. 4A, 4B, and 4C. Referring to FIGS. 4A and 4B (which are top perspective views), and 4C (a top view), module 200 includes body 210 defined by an outer peripheral wall 220 that includes a top edge and a bottom edge. Bordering the top edge is a perimeter of module top 212. Bordering the bottom edge is a perimeter of module bottom 214. An opening 222 to an interior (not illustrated) allows for gaseous atmosphere of interior 101 to pass into interior of module 200. Opening 222 can optionally be covered by a gas-permeable membrane. The interior includes a desiccant (not illustrated).

Shown at FIG. 4B is another example of module 200, this example including extension 230, which operates as a cover support. Extension 230 includes vertical extension sidewalls 240, horizontal extension bottom 244, and horizontal extension top 242. Bottom 244, sidewalls 240, and top 242 are each rigid and stationary relative to a base of a hard disk drive. In use, extension top 242 may be or may include a surface that contacts an interior surface of a cover of a hard disk drive to prevent movement of the cover. Optionally located in contact with extension top 242 may be a connecting structure 250, which may be or may include a polymeric, elastic, or flexible structure such as a polymeric gasket (e.g., a "form-in-place" gasket), foam, adhesive, or a combination of these.

Figure 5A:
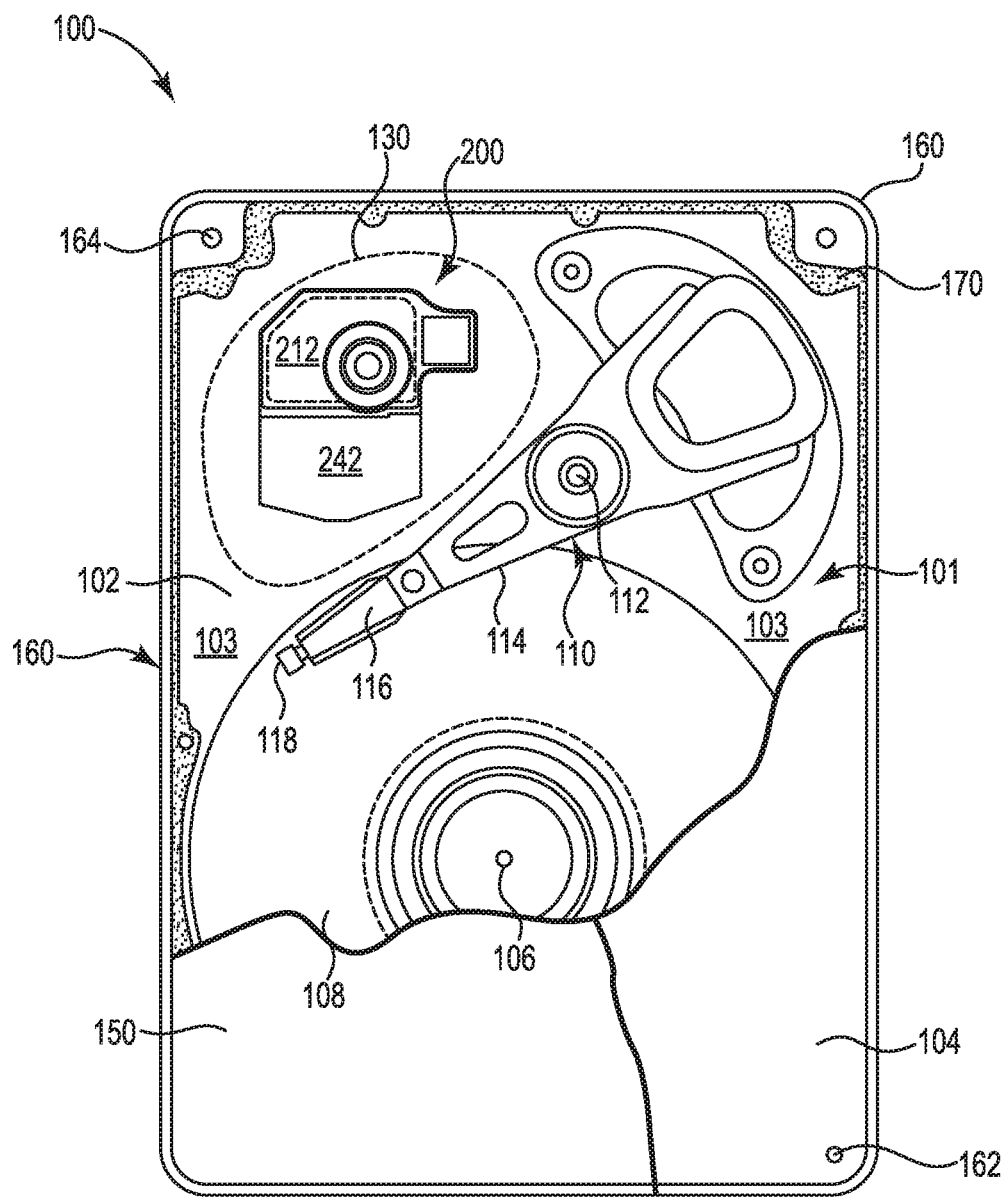
FIGS. 5A and 5B are a top view and a side cut-away view of a hard disk drive that includes an environmental control module as described, that includes a cover support.
Figure 5B:
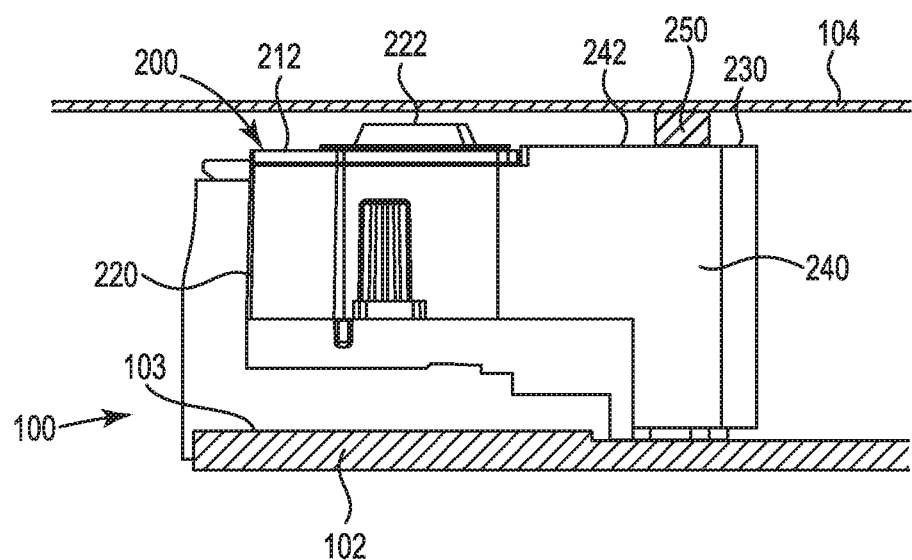

In use (see FIGS. 5A (top view) and 5B (side-view)), module 200 with extension 230 can be installed securely at a location within an interior 101 of a hard disk drive 100, e.g., at region 130. When so installed, extension bottom 244 may engage (directly or indirectly) a bottom 103 of base 102, or another secure structure. Extension top 242, optionally through connecting structure 250, contacts an interior surface of cover 104 to prevent movement, deflection, or vibration of cover 104 during assembly or use. As shown schematically in the side cut-away view of FIG. 5B, module 200 contacts and sits on top of bottom 103 of base 102. Upper surfaces 212 and 242 of module 200 face toward an interior surface of cover 104. Connecting structure 250 contacts surface 242 and also contacts the interior surface of cover 104 to inhibit or prevent movement (deflection, vibration) of cover 104.

The cover of a hard disk drive as described can be any cover that functions to contain air (in an un-sealed drive) or helium (in a hermetically-sealed drive) within the hard disk drive interior. The cover is secured at a perimeter to sidewalls of the base, for example at upper (top) surfaces of the base, or at vertical sidewall surfaces.

Example covers may be completely or substantially flat, such as in the form of a cover that directly covers an interior 101 of a hard disk drive with a perimeter of the cover being secured to upper surfaces of sidewalls of the base. The cover is a rigid structure that may optionally be used to mechanically support one or more of the interior components of the hard disk drive. For example, a cover may optionally be used as a location to secure an end of a support for a stack of hard disks (spindle-disk assembly), an end of a support for an actuator assembly, etc., see for example FIG. 2. In other examples, a cover may include a number of apertures at the perimeter that function to allow placement of a fastener that secures the perimeter of the cover to a base sidewall, but does not include any aperture that is spaced from the perimeter and used to pass a fastener through the cover to secure the cover to an interior component (see FIG. 3).

The cover connects to the base at sidewalls of the base usually with a seal (gasket) between the two pieces. One example of a cover is an interior or "process cover" of a type used in certain commercial hard disk drives that include a low-density internal atmosphere (e.g., a 3.5 inch form factor HDD). See FIG. 2, showing cover 104 is an as an inner cover with a second (outer) cover 105 placed over cover 104. In other examples (see, e.g., FIG. 3), cover 104 is the only cover of a hard disk drive, and is not covered by a second cover; cover 104 is located at an exterior of a fully assembled disk drive 100.

The cover may be made of any material or combination of materials that is useful for a cover of a hard disk drive. Examples include aluminum, steel, other metal alloys, and laminates. In certain examples, a cover is a single thin sheet of solid metal or metal alloy such as steel or aluminum.

In some examples the cover can be a multi-layer sheet that includes two layers of metal joined by a layer of polymeric material (e.g., viscoelastic adhesive) disposed between the two metal (e.g., steel) layers. Such a laminated cover can be referred to sometimes as a "damped metal laminate" (DML). With these covers, shear motion between the two opposed metal layers of the DML cover is damped by the viscoelastic adhesive of the middle layer in a manner that effectively dissipates acoustic energy and vibration of the laminate cover in a way that is more effective that other covers made of a single continuous metal layer. The reduced vibration can be effective to improve performance of a hard disk drive by reducing the amount of external acoustic energy that is transferred to the cover and then to the interior components of a hard disk drive, such as magnetic disks and read and write heads, with a potential advantage of using the laminated cover being reduced error rates of the hard disk drive during operation.

The invention claimed is:

1. A hard disk drive comprising:
   a base comprising an interior,
   a cover secured to the base at a perimeter and covering the interior, the cover comprising an interior surface on an interior side of the cover,
   components within the interior, comprising:
   a disk stack assembly comprising multiple rotatable hard magnetic disks, and
   an armature assembly comprising multiple armatures in a pivoting stack, the assembly comprising armatures and magnetic heads capable of magnetically engaging the disks, and
   a cover support at the interior that limits movement of the cover in a direction toward the interior by contacting the interior side at a non-apertured location of the cover and suppresses vibration of the cover caused by acoustic energy.

2. A hard disk drive of claim 1 wherein the cover support comprises a polymeric composition in contact with the interior surface of the cover by adhesive.

3. A hard disk drive of claim 1 wherein the cover support comprises a rigid structure and a connecting structure, wherein the rigid structure is directly or indirectly engaged with the base and includes an upper surface, and the connecting structure comprises a polymeric material and is located between the upper surface and the interior surface of the cover.

4. A hard disk drive of claim 1 wherein the cover support is a structure of an environmental control module disposed between the base and the cover, with an upper surface of the environmental control module, or an optional connecting structure attached to the upper surface, contacting the interior surface.

5. A hard disk drive of claim 4 wherein the environmental control module comprises:
   a body comprising an interior defined by:
     an outer peripheral wall comprising a top edge and a bottom edge,
     a bottom surface at the bottom edge, and
     a top surface at the top edge,
   an opening to the interior, covered by a permeable membrane, and
   desiccant at the interior.

6. A hard disk drive of claim 5 wherein the environmental control module comprises an extension extending horizontally from the outer peripheral wall, wherein the cover support is located on an upper surface of the extension.

7. A hard disk drive of claim 1 wherein the cover is a planar metal or metal-laminate sheet having a perimeter secured to the base at a base sidewall.

8. A hard disk drive of claim 7 wherein the cover includes apertures at the perimeter, and fasteners pass through the apertures to secure the cover to the base at a base sidewall.

9. A hard disk drive of claim 7 wherein the cover includes one or more apertures spaced from the perimeter, each aperture having a fastener passing through the aperture, the fastener securing the cover to an interior structure of the hard disk drive.

10. A hard disk drive of claim 7 wherein the cover does not include any apertures spaced from the perimeter through which passes a fastener.

11. A hard disk drive of claim 1 wherein the cover is a laminate comprising a steel top layer, a steel bottom layer, and a viscoelastic adhesive layer between the top layer and the bottom layer.

12. A hard disk drive of claim 1 wherein the interior includes an air atmosphere.

13. A hard disk drive of claim 1 wherein the interior includes a helium atmosphere.

14. A hard disk drive of claim 1 wherein the hard disk drive exhibits a lower rate of error compared to a comparable hard disk drive that does not include the deflection inhibitor.

15. A hard disk drive of claim 1 wherein the hard disk drive exhibits reduced transmission of acoustic energy into the hard disk drive compared to a comparable hard disk drive that does not include the deflection inhibitor.

16. A method of assembling a hard disk drive comprising:
   a base comprising an interior,
   a cover secured to the base at a perimeter and covering the interior, the cover comprising an interior surface on an interior side of the cover,
   components within the interior, comprising:
   a disk stack assembly comprising multiple rotatable hard magnetic disks, and
   an armature assembly comprising multiple armatures in a pivoting stack, the assembly comprising armatures and magnetic heads capable of magnetically engaging the disks, and
   a cover support at the interior that limits movement of the cover in a direction toward the interior by contacting the interior side at a non-apertured location of the cover, the method comprising:
   placing the cover over the base and securing the cover to the base at the perimeter of the base,
   removing a gaseous atmosphere from the interior, and
   placing a low density gaseous atmosphere at the interior.

17. A method of claim 16 wherein:
   the cover support is connected to an environmental control module, and
   the method includes placing the environmental control module into the interior subsequent to placement of a magnetic recording disk into the interior, subsequent to placement of an armature assembly into the interior, and subsequent to placement of an actuator assembly into the interior.

18. A hard disk drive comprising:
   a base comprising an interior;
   a cover secured to the base at a perimeter and covering the interior, the cover comprising an interior surface on an interior side of the cover,
   components within the interior, comprising:
   a disk stack assembly comprising multiple rotatable hard magnetic disks, and
   an armature assembly comprising multiple armatures in a pivoting stack, the assembly comprising armatures and magnetic heads capable of magnetically engaging the disks, and
   a cover support at the interior that limits movement of the cover in a direction toward the interior by contacting the interior side at a non-apertured location of the cover,
   wherein the cover support comprises a polymeric composition in contact with the interior surface of the cover.

19. A hard disk drive of claim 18 wherein the cover support comprises a rigid structure and a connecting structure, wherein the rigid structure is directly or indirectly engaged with the base and includes an upper surface, and the connecting structure comprises the polymeric composition located between the upper surface and the interior surface of the cover.

* * * * *